United States Patent [19]
Fellner

[11] Patent Number: 5,561,316
[45] Date of Patent: Oct. 1, 1996

[54] EPITAXIAL SILICON STARTING MATERIAL

[75] Inventor: Richard A. Fellner, Fort Collins, Colo.

[73] Assignee: Hewlett-Packard Co., Palo Alto, Calif.

[21] Appl. No.: 389,610

[22] Filed: Feb. 14, 1995

Related U.S. Application Data

[60] Continuation of Ser. No. 132,938, Oct. 7, 1993, abandoned, which is a division of Ser. No. 984,725, Dec. 1, 1992, Pat. No. 5,296,047, which is a continuation of Ser. No. 827,138, Jan. 28, 1992, abandoned.

[51] Int. Cl.$^6$ .............................. H01L 29/00; H01L 23/58
[52] U.S. Cl. ........................ 257/549; 257/550; 257/913
[58] Field of Search ................................. 257/550, 549, 257/913

[56] References Cited

U.S. PATENT DOCUMENTS 3,961,340  6/1976  Encinas .................................. 257/549

*Primary Examiner*—Steven H. Loke

[57] ABSTRACT

A silicon starting material for fabricating integrated circuits is desrcibed that comprises a silicon wafer substrate material and a first epitaxial layer grown on the wafer substrate material which eliminates stacking faults in the subsequent fabrication of a semiconductor device.

8 Claims, 2 Drawing Sheets

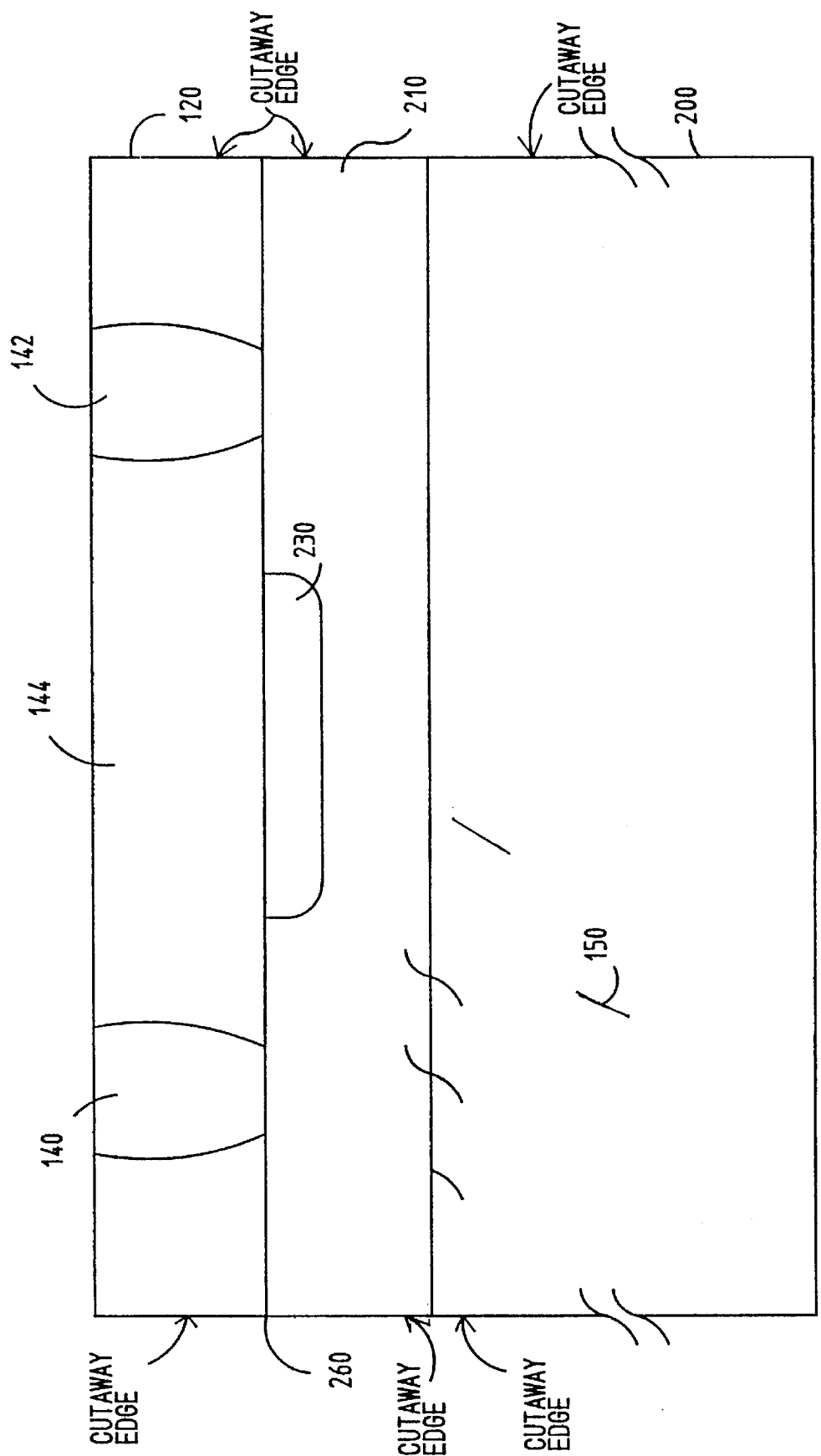

5,561,316

EPITAXIAL SILICON STARTING MATERIAL

This is a continuation of copending application Ser. No. 08/132,938 filed Oct. 7, 1993, now abandoned, which is a division of application Ser. No. 07/984,725, filed on Dec. 1, 1992, now U.S. Pat. No. 5,296,047, which is a continuation of application Ser. No. 07/827,138, filed on Jan. 28 1992 now abandoned.

BACKGROUND OF THE INVENTION

1. Field of the Invention

The present invention pertains generally to integrated circuit fabrication on silicon starting material.

2. Description of the Background

Typical bipolar and BiCMOS integrated circuits are manufactured on p-type silicon substrate wafers. The substrate of these wafers is used as the starting material for the integrated circuit fabrication. Generally, early in the process an epitaxial silicon layer is grown on the starting material. It is in this epitaxial layer that the semiconductor devices such as transistors, diodes, resistors, capacitors or other devices are fabricated.

Typically, before the epitaxial layer is grown, a buried layer is fabricated at the interface of the epitaxial layer and the silicon starting material in order to reduce series resistance within the device.

The quality and yield of the integrated circuit depends upon many factors. One of these factors is the quality of the epitaxial layer. This layer needs to be as uniform and consistent in its crystal orientation and structure as possible. Defects or deformities in this crystalline structure cause electrical problems and specifically, collector to emitter shorts among other problems.

In the standard process, because the wafer substrate is used as the starting material, interstitial oxygen in the starting material precipitates during thermal cycles. These precipitates nucleate stacking faults. The stacking faults are used to absorb metal contaminants which can cause electrical problems.

However, these stacking faults can also intersect the surface of the starting material. When this occurs, the stacking faults are replicated in the epitaxial layer grown on top of the starting material causing deformities in the crystalline structure, that in turn cause electrical problems.

Prior art solutions addressed this problem by depleting the substrate surface of oxygen before growing the epitaxial layer by backing the substrates in a diffusion furnace in a process known as denuding. This procedure, however, does not completely deplete the substrate surface of oxygen, it only reduces the amount of oxygen at the substrate surface. Since this procedure still leaves some oxygen, the remaining oxygen precipitates at the substrate surface and nucleates stacking faults. There remains a need to virtually eliminate the oxygen and thus the stacking faults.

SUMMARY OF THE INVENTION

The present invention overcomes the limitations of the prior art by providing a silicon starting material for fabricating integrated circuits comprising a silicon wafer substrate material and a first epitaxial layer grown on the wafer substrate.

When epitaxial silicon is used as the starting material, there is no precipitation of interstitial oxygen since there is essentially no interstitial oxygen in epitaxial silicon. No stacking faults are nucleated, therefore none intersect the first epitaxial surface that interfaces with the second epitaxial layer. Consequently, no stacking faults are replicated into the second epitaxial layer and this second epitaxial layer is substantially free of stacking faults.

BRIEF DESCRIPTION OF THE DRAWINGS

FIG. 2 is a cross sectional view of an embodiment of the invention.

DETAILED DESCRIPTION

Figure 1:
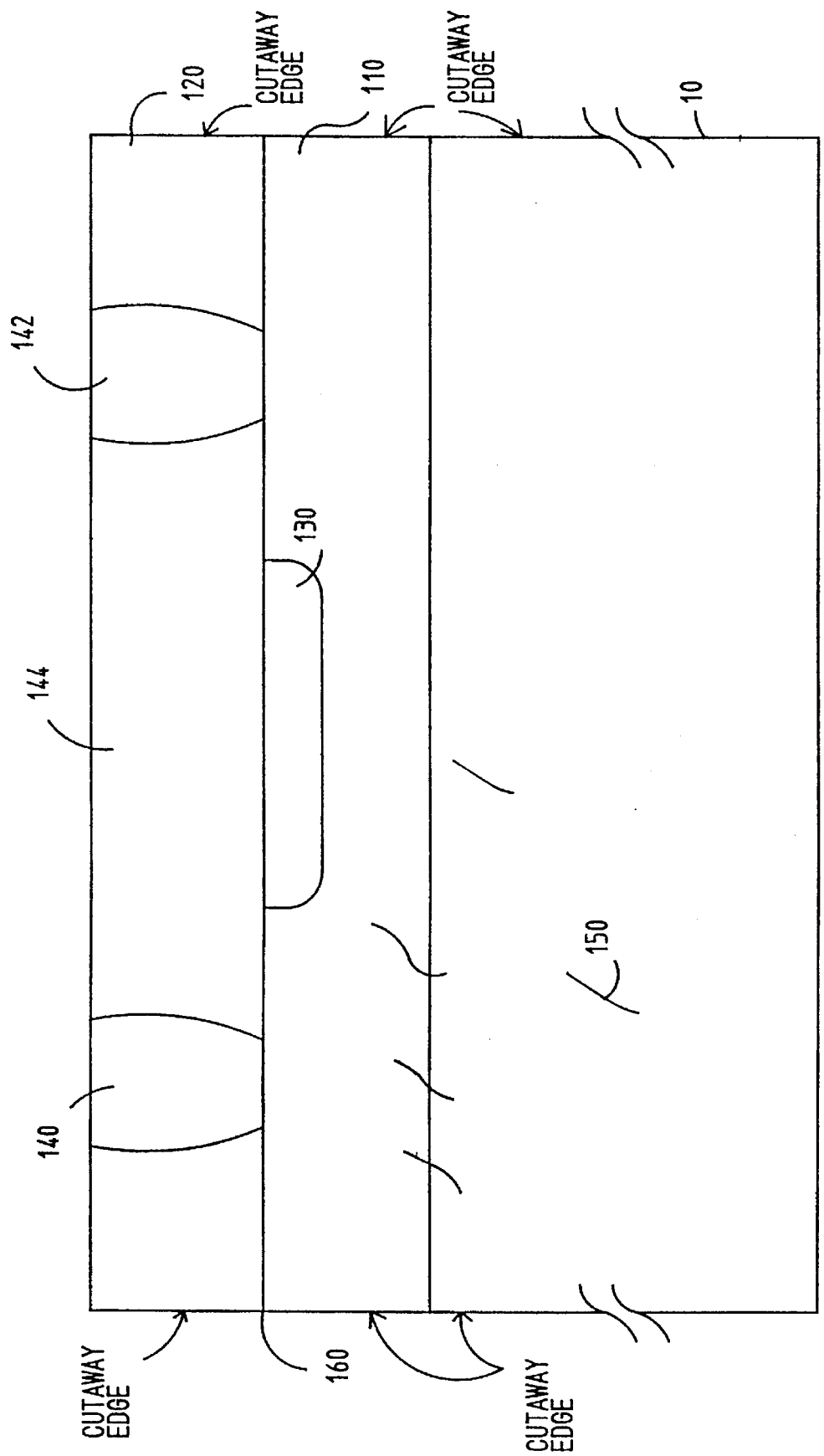
FIG. 1 is a cross sectional view of the invention.

FIG. 1 shows the silicon wafer substrate (10). In the prior art, this substrate (10) would be the starting material and well known semiconductor fabrication methods would start with the fabrication of the buried layer into this substrate. Typically, this wafer is sliced and processed from a silicon ingot produced by the Czochralski method. The Czochralski method is generally done in an atmosphere that permits oxygen to be absorbed by the silicon and this oxygen resides interstitially in the silicon crystal structure. Silicon wafer substrates can be made for a variety of crystal orientation known as 100, 101, or 111; for a particular doping type, pure, n-type, or p-type; and for various resistivity levels measured in ohms per square. This invention can improve the quality of the semiconductor devices fabricated whenever interstitial oxygen is present in the silicon wafer substrate whether or not the substrate was specifically produced by the Czochralski method and for any of the different varieties and combinations of orientation, doping type, and resistivity.

By any variety of well known techniques, the first epitaxial layer (110) of the same doping type and resistivity of the silicon substrate (10) is grown on top of the silicon substrate (10). The epitaxial growth process is fundamentally a different silicon crystal growth process than the Czochralski method. The epitaxial growth process is done in a substantially oxygen-free atmosphere, thus no interstitial oxygen accumulates in the epitaxial silicon crystal. Various thicknesses of the first epitaxial layer can be used depending on the specific process capabilities, specific process requirements, and specific devices to be fabricated.

This combination of substrate 10 and epitaxial layer 110 is the new starting material (160) for the processing of semiconductor devices. Using any variety of well known semiconductor processing methods, the buried layer (130) can be fabricated in the starting material (160), an epitaxial layer (120) can be grown, isolation wells (140, 144) can be fabricated and the region 144 is created for the fabrication of semiconductor devices into this second epitaxial layer (120). The particular parameters depend on the specific process, specific devices, and specific product requirements.

During the semiconductor fabrication, stacking faults (150) are created from the interstitial oxygen. These stacking faults (150) extend into the first epitaxial layer (110) and would normally cause electrical problems with the semiconductor devices and circuits fabricated in this first epitaxial layer using the substrate (10) for the starting material as in the prior art. In the present invention, since the stacking faults (150) do not extend into the second epitaxial layer, electrical problems for the semiconductor devices and circuits due to the stacking faults are eliminated.

FIG. 2 shows an embodiment of the invention. The substrate (200) is a p-type doping silicon wafer. The first epitaxial layer (210) is also p-type doping. In this embodiment, the first epitaxial layer is between 7 and 10 microns thick. The substrate (200) and the first epitaxial layer (210) form the starting material (260). The buried layer (230) is an n+n-type doping (a heavy concentration of n-type doping).

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A silicon starting material having a doping type and a resistivity for fabricating semiconductor devices comprising: p1 a silicon wafer substrate material having a first doping type and a first resistivity; and p1 a first epitaxial layer with an upper surface, grown on said silicon wafer substrate material, said first epitaxial layer having said first doping type and said first resistivity, p1 wherein said first epitaxial layer is grown before any intervening high temperature processing, thereby rendering the starting material substantially free of stacking faults at said upper surface of said first epitaxial layer for subsequent fabrication of the semiconductor devices.

2. The material of claim 1 wherein a second epitaxial layer is grown on the first epitaxial layer and a semiconductor device is fabricated in the second epitaxial layer.

3. The material of claim 1 wherein said first doping type is a p-type.

4. The material of claim 1 further comprising a buried layer having a second doping type fabricated in said first epitaxial layer, wherein said buried layer interfaces with said upper surface.

5. A silicon starting material having a doping type and a resistivity for fabricating semiconductor devices comprising:

a silicon wafer substrate material having a first doping type and a first resistivity; and a first epitaxial layer with an upper surface, grown on said silicon wafer substrate material, said first epitaxial layer having said first doping type and said first resistivity, wherein said first epitaxial layer is substantially free of stacking faults at said upper surface of said first epitaxial, thereby preventing the nucleation of stacking faults into semiconductor devices fabricated thereon.

6. The silicon starting material of claim 5 further comprising a second epitaxial layer, grown on said upper surface, and a semiconductor device fabricated in said second epitaxial layer.

7. The silicon starting material of claim 5 wherein said first doping type is a p-type.

8. The silicon starting material of claim 5 further comprising a buried layer having a second doping type fabricated in said first epitaxial layer, wherein said buried layer interface with said upper surface.

* * * * *

UNITED STATES PATENT AND TRADEMARK OFFICE
CERTIFICATE OF CORRECTION

PATENT NO. : 5,561,316
DATED : 10/01/96
INVENTOR(S) : Richard A. Fellner

It is certified that error appears in the above-indentified patent and that said Letters Patent is hereby corrected as shown below:

Column 1, line 7, After "*1992*" insert a comma -- , --.

Column 3, Claim 1, line 20: Delete "*p1*".

Column 3, Claim 1, line 20: Start a new paragraph with "*a silicon wafer*".

Column 3, Claim 1, line 21: Delete "*p1*" and start a new paragraph with "*a first epitaxial*".

Column 3, Claim 1, line 24: Delete "*p1*" and start a new paragraph with "*wherein said*".

Column 4, Claim 5, line 18: After "*epitaxial*" insert --*layer*--.

Column 4, Claim 8, line 30: Change "*interface*" to --*interfaces*--.

Signed and Sealed this

Ninth Day of November, 1999

Q. TODD DICKINSON

Attest:

Attesting Officer

Acting Commissioner of Patents and Trademarks